United States Patent
Keuss

(10) Patent No.: US 7,504,830 B2
(45) Date of Patent: Mar. 17, 2009

(54) DUAL LOAD TESTER

(75) Inventor: Steven D. Keuss, St. Louis, MO (US)

(73) Assignee: Associated Equipment Corp., St. Louis, MO (US)

( * ) Notice: Subject to any disclaimer, the term of this patent is extended or adjusted under 35 U.S.C. 154(b) by 177 days.

(21) Appl. No.: 11/329,908

(22) Filed: Jan. 11, 2006

(65) Prior Publication Data

US 2006/0273783 A1    Dec. 7, 2006

Related U.S. Application Data

(60) Provisional application No. 60/750,768, filed on Dec. 15, 2005, provisional application No. 60/687,816, filed on Jun. 6, 2005.

(51) Int. Cl.
*G01N 27/416* (2006.01)
*H02J 7/00* (2006.01)

(52) U.S. Cl. .............. 324/426; 320/117; 324/429; 324/433; 324/435

(58) Field of Classification Search .......... 324/426, 324/429, 433, 435; 320/117
See application file for complete search history.

(56) References Cited

U.S. PATENT DOCUMENTS

| | | | |
|---|---|---|---|
| 3,599,094 A * | 8/1971 | Pring .................... 324/429 |
| 3,848,181 A * | 11/1974 | Hebert et al. ........... 324/429 |
| 4,719,428 A | 1/1988 | Liebermann |
| 5,572,136 A | 11/1996 | Champlin |
| 5,708,347 A | 1/1998 | Palanisamy et al. |
| 5,714,962 A | 2/1998 | Josefsson |
| 5,757,192 A | 5/1998 | McShane et al. |
| 5,767,661 A | 6/1998 | Williams |
| 5,773,978 A | 6/1998 | Becker |
| 5,789,899 A | 8/1998 | van Phuoc et al. |
| 5,818,234 A * | 10/1998 | McKinnon ............... 324/433 |
| 5,821,756 A | 10/1998 | McShane et al. |
| 5,831,435 A | 11/1998 | Troy |
| 5,831,436 A | 11/1998 | Borland |
| 5,872,433 A | 2/1999 | Sakai |
| 5,914,605 A | 6/1999 | Bertness |
| 5,945,829 A | 8/1999 | Bertness |
| 5,969,625 A | 10/1999 | Russo |
| 6,037,751 A | 3/2000 | Klang |
| 6,037,777 A | 3/2000 | Champlin |
| 6,037,778 A | 3/2000 | Makhija |

(Continued)

*Primary Examiner*—Akm E Ullah
*Assistant Examiner*—Johali A Torres Ruiz
(74) *Attorney, Agent, or Firm*—Robert O. Enyard, Jr.; Polsinelli Shugart PC

(57) ABSTRACT

The apparatus relates to a dual load tester that is hand held and highly portable. The dual load tester includes two resistive loads, and the two resistive loads may be used in series or one of the resistive loads may be used individually to test batteries, charging systems and starter motors of different voltage and current ratings. The operator of the device may, by closing the appropriate switch, first test a 12-volt battery and then test a 24-volt battery. In a similar manner, the tester may be used to test charging systems and starter motors of different voltage and current ratings. The testing functions of the dual load tester may be automated for testing various devices. The dual load tester includes a first resistive load and a second resistive load. The resistive loads may be used together or individually to test a battery, charging system, starter motor or other device.

18 Claims, 5 Drawing Sheets

U.S. PATENT DOCUMENTS

| | | | |
|---|---|---|---|
| 6,051,976 A | 4/2000 | Bertness | |
| 6,061,638 A | 5/2000 | Joyce | |
| 6,081,098 A | 6/2000 | Bertness et al. | |
| 6,091,245 A | 7/2000 | Bertness | |
| 6,104,167 A | 8/2000 | Bertness et al. | |
| 6,166,523 A | 12/2000 | Singh | |
| 6,172,505 B1 | 1/2001 | Bertness | |
| 6,181,109 B1 | 1/2001 | Maio | |
| 6,184,650 B1 | 2/2001 | Gelbman | |
| 6,225,808 B1 | 5/2001 | Varghese et al. | |
| 6,242,886 B1 | 6/2001 | Palanisamy | |
| 6,294,897 B1 | 9/2001 | Champlin | |
| 6,313,607 B1 | 11/2001 | Champlin | |
| 6,313,608 B1 | 11/2001 | Varghese et al. | |
| 6,316,914 B1 | 11/2001 | Bertness | |
| 6,323,650 B1 | 11/2001 | Bertness et al. | |
| 6,329,793 B1 | 12/2001 | Bertness et al. | |
| 6,331,762 B1 | 12/2001 | Bertness | |
| 6,332,113 B1 | 12/2001 | Bertness | |
| 6,351,102 B1 | 2/2002 | Troy | |
| 6,356,058 B1 | 3/2002 | Maio | |
| 6,356,853 B1 * | 3/2002 | Sullivan | 702/117 |
| 6,359,441 B1 | 3/2002 | Bertness | |
| 6,359,442 B1 | 3/2002 | Henningson et al. | |
| 6,363,303 B1 | 3/2002 | Bertness | |
| 6,366,054 B1 | 4/2002 | Hoenig et al. | |
| 6,392,414 B2 | 5/2002 | Bertness | |
| 6,466,025 B1 * | 10/2002 | Klang | 324/429 |
| 7,235,977 B2 * | 6/2007 | Koran et al. | 324/426 |
| 2002/0175687 A1 * | 11/2002 | Bertness | 324/426 |
| 2004/0232918 A1 * | 11/2004 | Bertness et al. | 324/426 |
| 2005/0035752 A1 * | 2/2005 | Bertness et al. | 324/120 |

* cited by examiner

DUAL LOAD TESTER

CROSS-REFERENCES TO RELATED APPLICATIONS

This application claims the benefit of U.S. Provisional Application No. 60/687,816, filed Jun. 6, 2005 and U.S. Provisional Application No. 60/750,768 filed Dec. 15, 2005.

FIELD OF THE INVENTION

The present invention relates to a tester for testing the condition of batteries, charging systems and starter motors using different resistive loads. The present invention provides improved devices and methods of testing such devices under load conditions approximating actual operating loads.

BACKGROUND OF THE INVENTION

Testers capable of testing multiple device types and voltage or current ratings are known in the art, but do not place the tested device under load conditions simulating actual use of the device. Testers capable of testing a single device type of a single voltage or current rating under a load are known, but are not capable of testing multiple device types or devices of varying voltage or current ratings with a single tester. The present invention overcomes the limitation in the devices and methods known in the prior art and allows a single tester to be used to test multiple types of devices and devices of various voltage or current ratings under a load similar to typical operating conditions.

SUMMARY OF INVENTION

The present invention relates to a dual load tester that is hand held and highly portable. The tester of the present invention comprises two resistive loads, wherein the two resistive loads may be electrically connected in series or one of the resistive loads may be used individually to test batteries, charging systems, starter motors or other devices of different voltages and sizes. By a mere actuation of a switch, the operator may first test a 12-volt battery and then test a 24-volt battery. In a similar manner, the tester may be used to test charging systems and starter motors of different voltage ratings.

It is an aspect of the present invention to provide a hand-held tester capable of testing both 12-volt and 24-volt batteries, charging systems and starter motors.

It is an aspect of the present invention to provide a highly portable hand-held tester with the capability of testing batteries, charging systems and starter motors of various ratings and sizes.

It is an aspect of the present invention to place the battery, charging system, or starter motor under a load during the test that is similar to the load on the tested device of actual use.

DETAILED DESCRIPTION OF THE INVENTION

Figure 1:
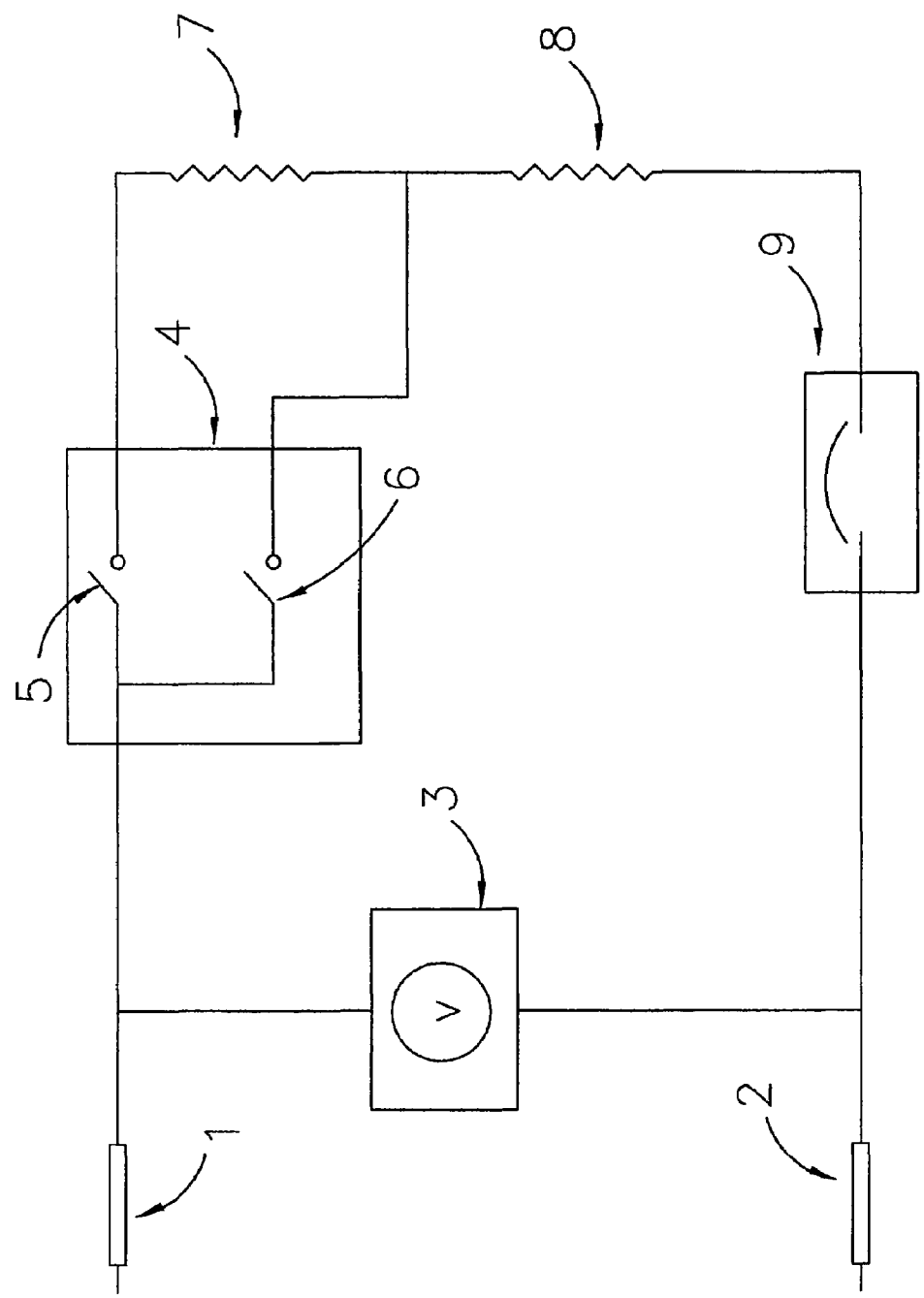
FIG. 1 shows a schematic view of the dual load tester of the present invention.

The present invention relates to a dual load tester. The tester of the present invention comprises two resistive loads, wherein the two resistive loads may be used together or one of the resistive loads may be used individually to test devices of different voltages and sizes. The two resistive loads may be wired in series. A switching mechanism directs the voltage from the device to be tested across one or both of the resistive loads, and thereby develops a load current through the resistive loads.

The tester may be used to test multiple types of devices including batteries, charging systems and starter motors. The charging systems include devices such as alternators used for charging batteries.

Importantly, such devices of different ratings and outputs may be tested using the single piece of equipment of the present invention. For example, both a 12-volt battery and a 24-volt battery may be tested using the dual load tester of the present invention. Similarly, a 12-volt starter motor or charging system and a 24-volt charging system or starter motor may be tested using the dual load tester of the present invention.

The dual load tester of the present invention also subjects the device to be tested to a load similar to the load on the device under normal operating conditions. Many battery, charging system or starter motor testers simply measure the voltage created by the device under no-load or low-load conditions. The device of the present invention subjects the tested device to a load that varies based on the resistance of resistive loads 7 and 8 as described below. Typical loads generated by the device of the present invention range from 60 amperes to 120 amperes.

The dual load tester of the present invention further comprises: a housing to contain and include electrical components, a handle for the operator to "grip" the tester, and electrical leads to attach or electrically connect to the battery, charging system or starter motor being tested. The electrical leads may include clamps to connect to the terminals of a battery, charging system or starter motor being tested. The housing may be vented to help dissipate heat.

The electrical components comprise the two resistive loads, a switching mechanism, an optional current protector, a voltage meter to display test results, and the necessary electrical wiring to provide electrical connectivity between the other electrical components and to the device to be tested. The electrical components may further comprise electronic circuitry to automatically perform test functions.

One embodiment of the present invention includes a switching mechanism comprised of two switches. The actuation of one of the switches will electrically connect the device to be tested to only one of the resistive loads, thereby applying a voltage across and developing a current through only one resistive load. The actuation of the other switch will electrically connect the device to be tested to both of the resistive loads, thereby applying a voltage across and developing a current through both of the resistive loads.

The present invention provides a small lightweight hand-held device. It is highly portable and convenient to carry. Certain embodiments may have a housing of approximately three inches by approximately six inches by approximately three inches, and may include a handle extending outwardly from the housing.

The dual load tester of the present invention may be used on both a 12-volt and a 24-volt device with the mere actuation of the switching mechanism. The dual nature of the present invention allows a mechanic to have a single tool that may be used on, for example, smaller vehicles having 12-volt batteries and larger vehicles, such as trucks or military vehicles or large industrial equipment that have 24-volt batteries.

The present invention will now be discussed with reference to a first, second and third embodiment of the present invention illustrated in the Figures.

The first embodiment, as shown in FIG. 1, includes the two resistive loads 7 and 8 that are electrically connected in series. The device to be tested is electrically attached to the dual load tester by electrical leads 1 and 2. A switching mechanism 4, comprised in this embodiment of switches 5 and 6, is electrically connected between a device to be tested and the resistive loads 7 and 8 so that in one position with only switch 5 actuated in the closed position the switching mechanism 4 directs voltage from the device across both resistive loads 7 and 8 electrically connected in series thereby developing current through both resistive loads. In another position with only switch 6 actuated in the closed position, or with both switches 5 and 6 actuated in the closed position, the switching mechanism 4 directs voltage across resistive load 8 only. The device to be tested then generates a current that is directed by switching mechanism 4 through resistive loads 7 and 8. The voltage across resistive loads 7 and 8 is measured by a voltage meter 3. The embodiment shown in FIG. 1 also includes a current protector 9 further described below.

In order to test a device of one voltage rating, such as a 12-volt battery, electrical lead 1 is attached to the positive terminal of the device to be tested, and electrical lead 2 is attached to the negative or ground terminal of the device. The switch 6 in switching mechanism 4 is actuated and the voltage is directed to resistive load 8 only. The device to be tested then generates a current that is directed by switching mechanism 4 through resistive load 8. The voltage across resistive load 8 is then measured by voltage meter 3.

To test a device of another voltage rating, such as a 24-volt battery, electrical lead 1 is attached to the positive terminal of the device to be tested, and electrical lead 2 is attached to the negative or ground terminal of the device. The switch 5 is actuated to the closed position, switch 6 is actuated to the open position, and the voltage is directed to both resistive load 7 and to resistive load 8 that are wired in series. The device to be tested then generates a current that is directed by switching mechanism 4 through resistive loads 7 and 8. The voltage across resistive loads 7 and 8 is then measured by voltage meter 3. Thus, a single tester may be used to test both 12-volt and 24-volt devices.

Figure 2:
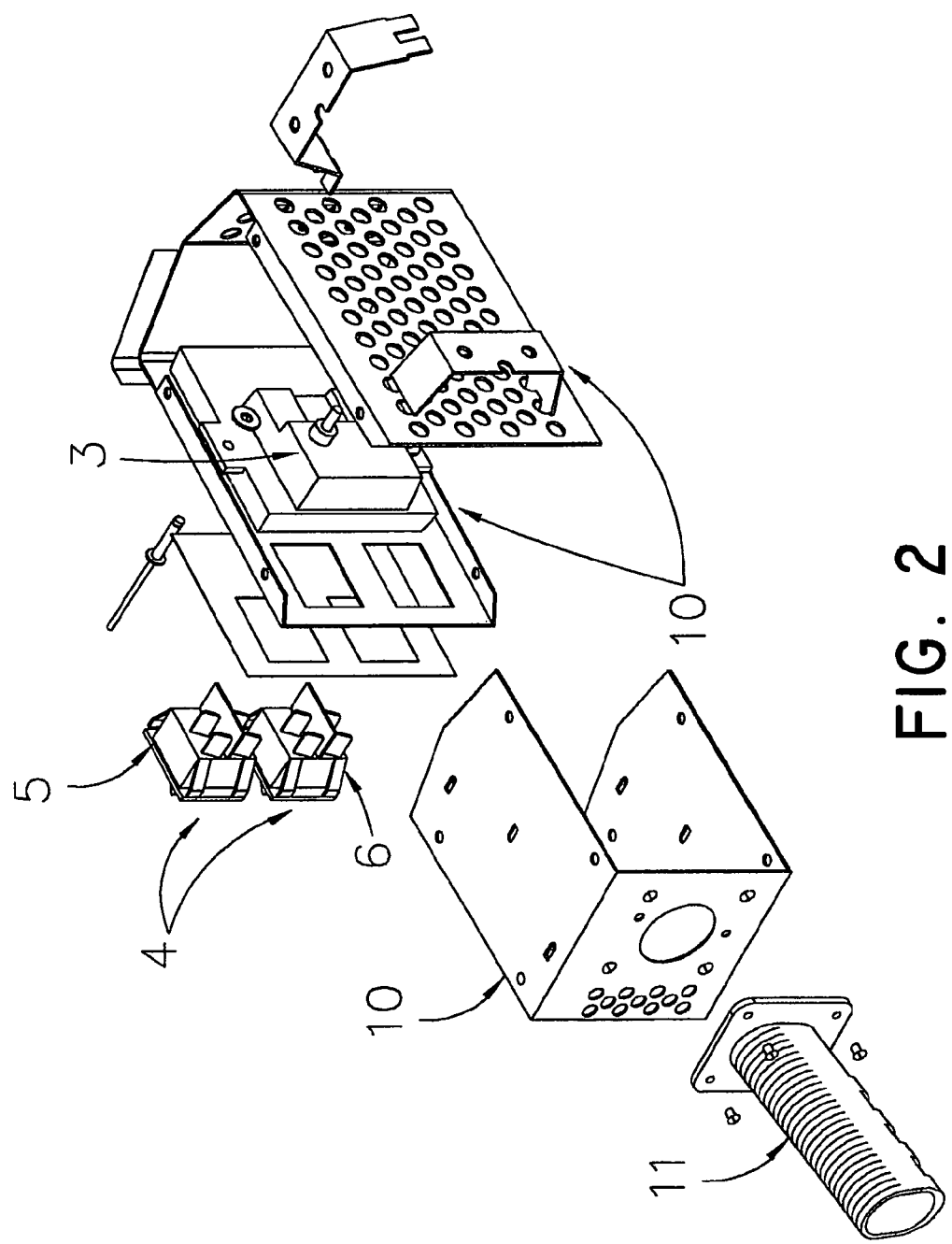
FIG. 2 shows a view of the handle and the housing of an embodiment of the present invention. The housing is shown with the two switches and the meter.

The first embodiment of the dual load tester of the present invention, as shown in FIG. 2, further comprises a handle 11 by which the hand-held device is held during operation. It also comprises a housing 10 to enclose the internal electrical components of the dual load tester. The switches 5 and 6, which comprise the switching mechanism 4 are mounted in the housing 10. The voltage meter 3 is also mounted in the housing 10. The housing may be comprised of multiple parts making up the complete enclosure of the internal components as shown in FIG. 2. The handle 11 is mounted on the bottom face of the housing 10. The housing 10 may contain openings to permit dissipation of heat generated by the resistive loads 7 and 8.

Figure 3:
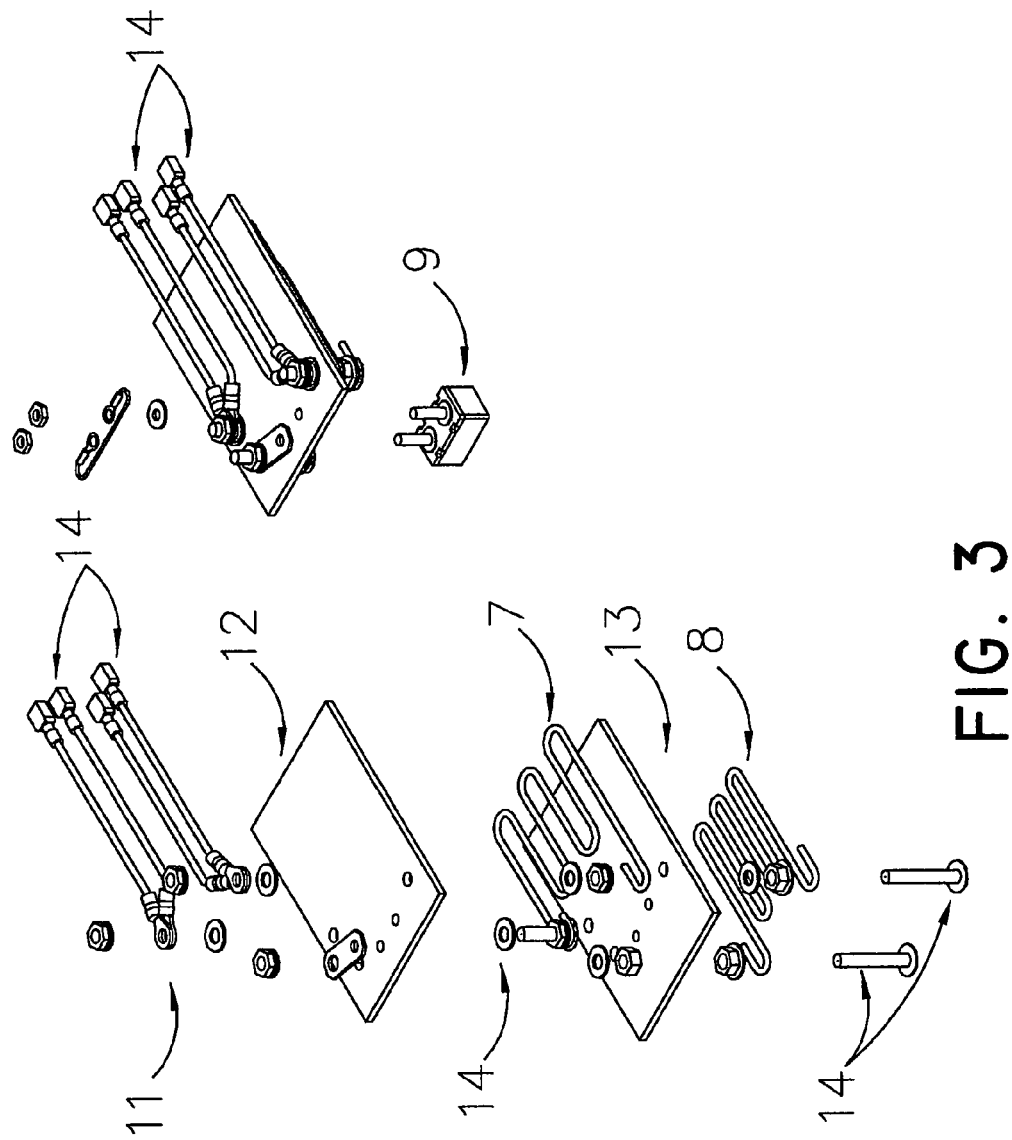
FIG. 3 shows a view of an embodiment of the two resistive loads and the heat shield.

In the first embodiment, as shown in the FIG. 3, the two resistive loads 7 and 8 are separated from other components of the tester by a heat shield 12. The heat shield 12 may comprise a glass-matted fiberboard, ceramic plate or other similar heat resistant materials. An additional heat shield 13 may be optionally "sandwiched" between the two resistive loads 7 and 8. The resistive loads 7 and 8 are electrically connected to each other and to other electrical components by connectors 14, which may be any electrical connectors appropriate for the voltage and current loads of the present invention as well known to one of skill in the art.

The two resistive loads 7 and 8 are configured in a manner to reduce the size of the dual load tester and increase the ease of holding the dual load tester in one hand. In the first embodiment of the invention the two resistive loads 7 and 8 are bent into a compact shape, such as that shown in FIG. 3. The two resistive loads 7 and 8 are also layered within the housing 10 to minimize the size of the dual load tester. The bends in the resistive loads and the layering of the resistive loads should not create electrical communication between the two resistive loads or between different portions of each resistive load.

FIG. 3 also shows the optional current protector 9 of the first embodiment of the present invention. The current protector 9 will prevent damage if, for example, a 24-volt battery is accidentally tested on a single resistive load. This configuration could produce approximately 6,000 watts of power, which may generate heat beyond the dissipation capability of a hand-held unit. The optional current protector 9 protects against such misuse by limiting the maximum current flowing through the dual load tester. The optional current protector 9 may be in the form of a breaker well known to one of skill in the art, such as a 12-volt/50-amp DC breaker. In a preferred embodiment, the breaker is of the "snap-action" type, which is commercially available from suppliers such as Fastco and Bussman. This "snap-action" breaker will automatically reset after it is tripped.

Figure 4:
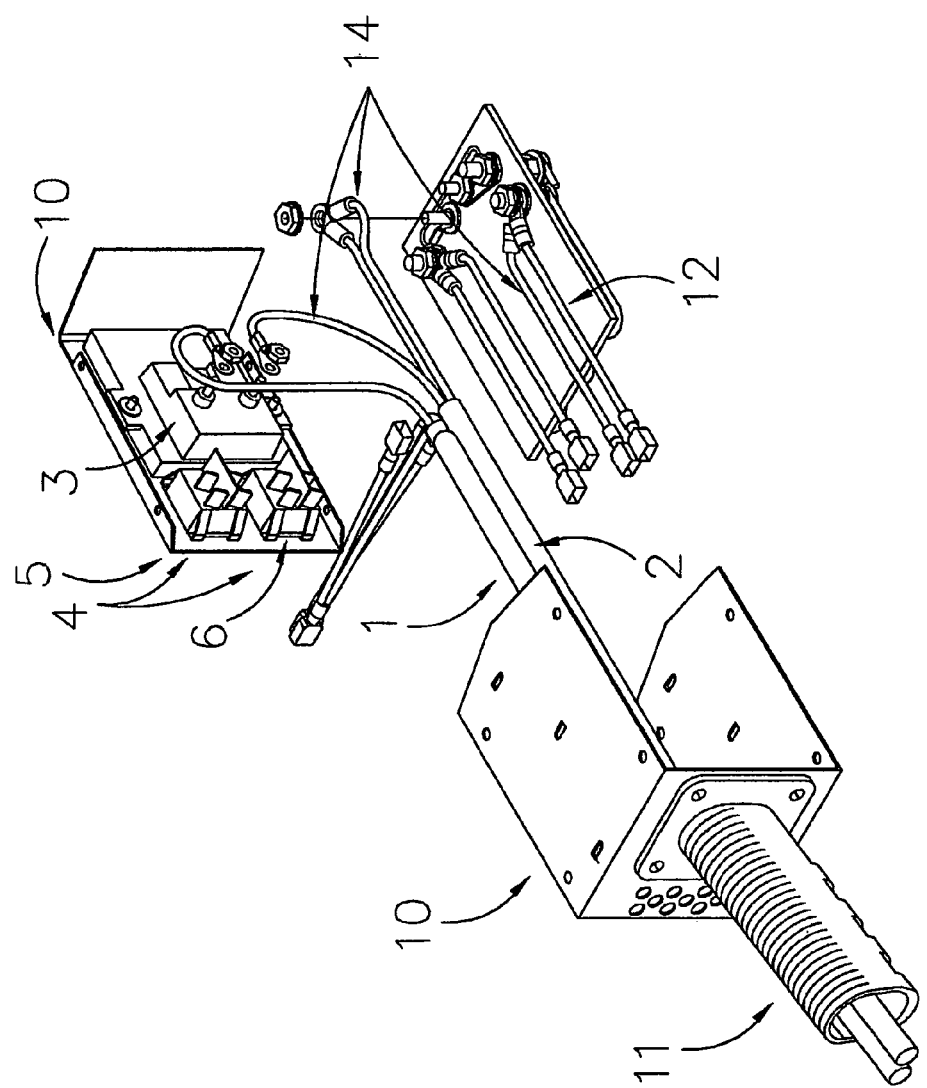
FIG. 4 shows an exploded view of an embodiment of the dual load tester of the present invention.

FIG. 4 shows an exploded view of the first embodiment of the present invention including the electrical leads 1 and 2 extending out through housing 10 and handle 11 for attachment to the device to be tested. The housing 10 is shown with switches 5 and 6, comprising switching mechanism 4, as well as voltage meter 3 mounted therein. The electrical leads 1 and 2 attach to resistive loads 7 and 8, switches 5 and 6 and voltage meter 3 via electrical connectors 14.

Figure 5:
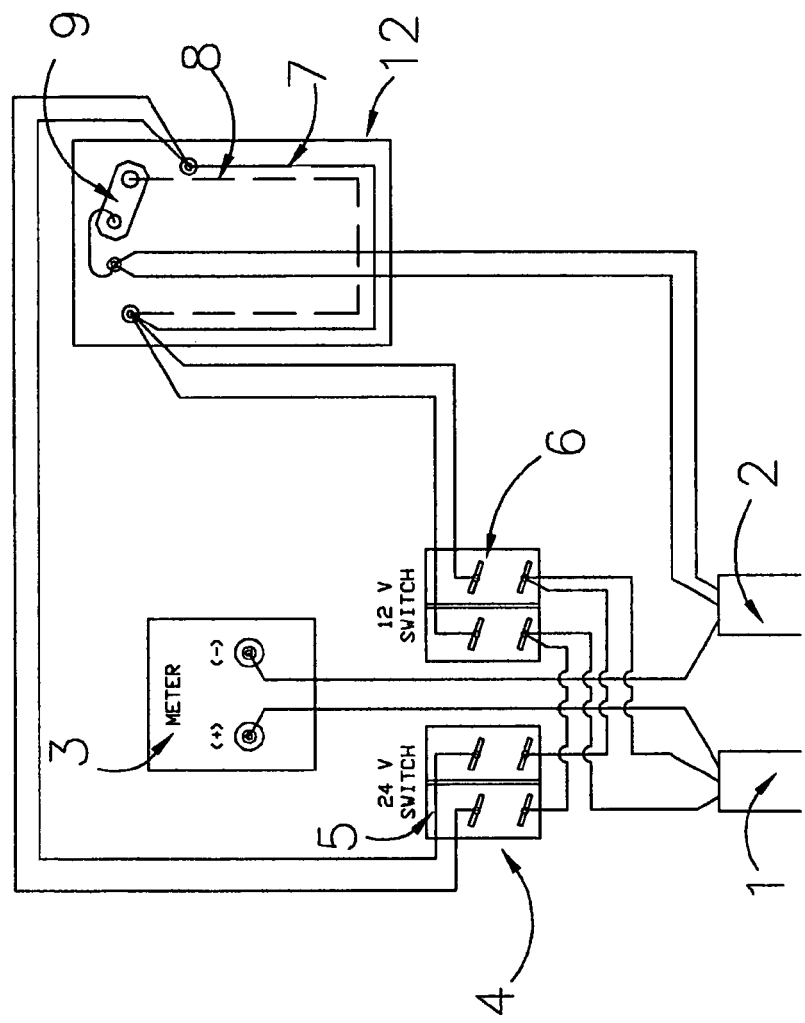
FIG. 5 shows a wiring diagram of an embodiment of the present invention.

A wiring diagram of the first embodiment of the present invention is shown in FIG. 5. Electrical leads 1 and 2 are shown in this embodiment with three electrical conductors in each lead, however this is not a limitation or requirement of the present invention. The lead 1 is electrically connected to the positive terminal of voltage meter 3, and the lead 2 is electrically connected to the negative terminal of voltage meter, also known as the reference or ground terminal. The lead 1 is also connected to poles of both switches 5 and 6. The other pole of switch 5 is electrically connected to a first terminal of resistive load 7. The other pole of switch 6 is electrically connected to a second terminal of resistive load 7 and to a first terminal of resistive load 8. The second terminal of resistive load 8 is connected to lead 2, or optionally to a terminal of current protector 9. A second terminal of optional current protector 9, if used is connected to lead 2.

In the embodiment shown in the Figures, the two resistive loads 7 and 8 may be made from nichrome wire. In other embodiments, different materials and components may be used for the resistive loads. The resistive loads of this invention may be made of any material that has a resistance that is substantially constant as the temperature of the resistive load increases. The resistance of the resistive loads 7 and 8 of the first embodiment of the present invention is between approximately 0.05 Ohms and approximately 0.25 Ohms, although other values of resistance may be used in the present invention. In a preferred embodiment of the present invention, the resistance of the resistive loads 7 and 8 are approximately equal to 0.1 Ohms. In a preferred embodiment of the present invention, the resistive loads 7 and 8 have approximately the same resistance value.

In the embodiment shown in the Figures, the switching mechanism comprises two switches 5 and 6 that may be depressed by the user. The switches should be located such that they are easy for the operator to actuate. The switching mechanism 4 is not limited by the particular details described herein, but could be replaced with other switching mechanisms known in the art. The switching mechanism 4 could also comprise a single multi-pole or multi-throw switch, digital switching mechanism or any switching mechanism known in the art. In other embodiments of the present invention, the switching mechanism might contain any number of physical switches configured to direct current and voltage as described above. The switching mechanism might also comprise separate electrical leads for attachment to devices of different voltage ratings. For example, there might be one negative or ground electrical lead, one electrical lead for attachment to a positive terminal of a 12 volt device, and another electrical lead for attachment to a positive terminal of a 24 volt device.

In the embodiment shown in the Figures, the electrical meter 3 includes a commercially available 0-28 volt direct-current voltage meter. The electrical meter 3 may be an analog voltage meter. The electrical meter 3 may also be a commercially available digital voltage meter. The digital voltage meter may include circuitry to automate test functions. The circuitry may store test programs to control automated test functions. The automated test functions include checking voltages after set time periods have elapsed and displaying alphanumeric test results on the digital meter display screen. The automated test functions may also include automated determination of whether a 12-volt or a 24-volt device is being tested.

The electrical leads 1 and 2 may be terminated by clamps of various kinds that are well known to one of skill in the art for use in electrically connecting cables to terminals of batteries, charging systems or starter motors.

In a second embodiment of the present invention, the dual load tester can test a battery of a given voltage rating at different loads. In this embodiment of the present invention, a mechanic could test a 12-volt battery with first a 60-ampere load and then a 125-ampere load.

In this second embodiment of the invention the tester of the present invention would be operated by actuating the switch 5 to test a device of a given voltage rating with one current load, and then switch 6 may be actuated to test a device of the same voltage rating with another current load.

In a third embodiment of the invention, the voltage meter 3 of the present invention may comprise a digital voltage meter. The digital voltage meter 3 of this embodiment may be capable of being programmed to automatically perform tests of batteries, charging systems or starter motors. For example, the digital voltage meter may, upon connection to a device to be tested, display the device voltage and automatically determine whether a 12 volt or a 24 volt device has been attached. The digital voltage meter may also automatically determine whether the attached device is a charging system, a starter motor or a battery. For example, upon attachment of the device to be tested to the present invention, if the voltage measured by the digital voltage meter is between approximately 13.2 and approximately 16.0 volts inclusive or greater than approximately 26.4 volts than the digital voltage meter may execute a charging system test. If the voltage is less than approximately 13.2 volts or between approximately 16.0 and approximately 26.4 volts the digital voltage meter may execute a battery/starter motor test.

The digital voltage meter 3 of the third embodiment may execute a charging system device test automatically. An example of such a test may include a delay of four seconds after attachment of the device to be tested. After the four second delay the voltage across the digital voltage meter may measure the voltage across the resistive loads 7 and 8. If the measured voltage is between than approximately 13.8 and approximately 15.2 volts for a 12 volt charging system device, or approximately 27.6 and approximately 30.4 volts for a 24 volt charging system device, the digital voltage meter may display a message indicating that the charging system device is "good" or has passed the test. If the measured voltage is less than approximately 13.7 volts for a 12 volt charging system device or less than approximately 27.6 for a 24 volt charging system device, the digital voltage meter may display a message indicating that the charging system device voltage is low or that device has not passed the test. If the measured voltage is greater than 15.2 for a 12 volt charging system or greater than approximately 30.4 volts for a 24 volt charging system, the digital voltage meter may display a messaging indicating that the charging system device voltage is high or that the device has not passed the test. It would be clear to one of skill in the art that the exact voltages of the present example might be varied and still be within the scope of the present invention.

The digital voltage meter 3 may also automatically execute a battery/starter motor test. During a battery/starter motor test the voltage across the resistive loads 7 and 8 is measured for 10 seconds. If at the end of ten seconds the measured voltage is greater than approximately 10.0 volts for a 12 volt battery, or greater than approximately 20.0 volts for a 24 volt battery then the digital voltage meter may display the voltage and alternatively indicate that the battery passed the test, otherwise the digital voltage meter may display the voltage and alternatively indicate that the battery failed the test. For a starter motor test, if at the end of 10 seconds the measured voltage is greater than approximately 9.1 volts for a 12 volt starter motor, or greater than approximately 18.2 volts for a 24 volt starter motor, the digital voltage meter may display the measured voltage and alternatively indicate that the starter motor passed the test, otherwise the meter may display the measured voltage and alternatively indicate that the starter motor failed the test.

As is evident from the foregoing description, certain aspects of the present invention are not limited by the particular details of the examples illustrated herein, and it is therefore contemplated that other modifications and applications, or equivalents thereof, will occur to those skilled in the art. It is accordingly intended that the claims shall cover all such modifications and applications that do not depart from the spirit and scope of the present invention.

What is claimed is:

1. A handheld dual load tester for performing a test on a power device, comprising:
    a first electrical lead to connect to a first terminal of the power device;
    a second electrical lead to connect to a second terminal of the power device;
    a first resistive load;
    a second resistive load;
    a switching mechanism to direct electrical voltage from first and second terminals of the power device to either both the first resistive load and the second resistive load or to the second resistive load;
    an electrical meter configured to:

connect to the first electrical lead and to the second electrical lead to measure a voltage across both the first resistive load and the second resistive load or across the second resistive load via the first and second leads compare the voltage to at least one predefined voltage threshold;

determine a test type to apply to the power device, the test type selected from a group consisting of a battery/staffer test and a charging system test;

apply the battery/starter test when the voltage is below the predefined voltage threshold and apply the charging system test when the voltage is above the predefined voltage threshold;

display a message indicating whether the power device has passed the applied test type;

a handheld housing for containing the first resistive load, the second resistive load, the electrical meter, and the switching mechanism;

wherein the first resistive load and the second resistive load have approximately the same resistance values; and, wherein the resistive loads may be used together or individually to test a battery, charging system, starter motor or other power device.

2. The handheld dual load tester according to claim 1, wherein the first resistive load and the second resistive load have resistance values between approximately 0.05 Ohms and approximately 0.25 Ohms.

3. The handheld dual load tester according to claim 1, wherein the first resistive load and the second resistive load have resistance values of approximately 0.1 Ohms.

4. The handheld dual load tester according to claim 1, wherein the first resistive load and the second resistive load are electrically connected in series.

5. The handheld dual load tester according to claim 1, wherein the switching mechanism comprises two switches.

6. The handheld dual load tester according to claim 1, wherein the electrical meter comprises a digital voltage meter.

7. The handheld dual load tester according to claim 1, further comprising an optional current protector.

8. The handheld dual load tester according to claim 1, further comprising a voltage meter electrically connected to measure the voltage across the resistive loads.

9. The handheld dual load tester according to claim 1, wherein the first resistive load and the second resistive load are layered.

10. A method for testing a device using a handheld dual load tester comprising:

selecting a device from one of a battery, charging system, or starter motor;

connecting the device to a first resistive load and a second resistive load contained in the handheld tester wherein the first resistive load and the second resistive load have approximately the same resistance values;

actuating a switching mechanism on the handheld tester;

directing an electrical current to a desired load, the desired load comprising either: both the first resistive load and the second resistive load, or to one of the first resistive load and the second resistive load;

measuring a voltage across the desired load;

comparing the voltage to at least one predefined voltage threshold to determine a test type to apply to the power device, the test type selected from a group consisting of a battery/starter test and a charging system test; and automatically applying the battery/starter test when the voltage is below the predefined voltage threshold and automatically applying the charging system test when the voltage is above the predefined voltage threshold.

11. The method of claim 10, wherein the first resistive load and the second resistive load are layered.

12. The method of claim 10, wherein a 12-volt battery is tested or a 24-volt battery is tested.

13. The method of claim 10, wherein a 12-volt charging system is tested or a 24-volt charging system is tested.

14. The method of claim 10, wherein a 12-volt staffer motor is tested or a 24-volt staffer motor is tested.

15. The method of claim 10, further comprising:

directing an electrical current to either: both the first resistive load and the second resistive load that are wired in series, or to one of the first resistive load and the second resistive load.

16. The method of claim 10, further comprising:

repeating the above steps with a second device of a different voltage or current rating than the first device.

17. The method of claim 10, further comprising:

electrically connecting the electrical leads to the terminals of a first device to be tested;

actuating the switching mechanism;

measuring the voltage across the resistive loads;

if the measured voltage is greater than approximately 13.2 volts and less than or equal to approximately 16.0 volts, or greater than approximately 26.4 volts executing a charging system test, if the measured voltage is greater than approximately 16.0 volts and less than or equal to approximately 26.4 volts, or less than approximately 13.2 volts executing a battery or starter motor test;

repeating the above steps with a second device of a different voltage rating than the first device.

18. The method of claim 10, comprising:

electrically connecting the electrical leads to the terminals of a charging system;

waiting four seconds after connecting the electrical leads to the charging system;

measuring the voltage across the resistive loads;

if the measured voltage is greater than approximately 13.8 volts and less than approximately 15.2 volts, or greater than approximately 27.6 volts and less than approximately 30.4 volts the digital voltage meter may display an alphanumeric message indicating that the device passed the test;

if the measured voltage is greater than approximately 13.2 volts and less than approximately 13.7 volts, or greater than approximately 26.4 volts and less than approximately 27.6 volts the digital voltage meter may display an alphanumeric message indicating that the device has failed the test or is low;

if the measured voltage is greater than approximately 15.2 volts and less than approximately 27.6 volts, or greater than approximately 30.4 volts, the digital voltage meter may display an alphanumeric message indicating that the device has failed the test or is high.

* * * * *

UNITED STATES PATENT AND TRADEMARK OFFICE
CERTIFICATE OF CORRECTION

PATENT NO. : 7,504,830 B2  Page 1 of 1
APPLICATION NO. : 11/329908
DATED : March 17, 2009
INVENTOR(S) : Steven D. Keuss It is certified that error appears in the above-identified patent and that said Letters Patent is hereby corrected as shown below:

Claim 1, col. 7, line 9: "staffer" should read --starter--

Claim 14, col. 8, line 13: "staffer" should read --starter--

Signed and Sealed this

Sixteenth Day of March, 2010

David J. Kappos
*Director of the United States Patent and Trademark Office*